United States Patent [19]
Yakushiji et al.

[11] Patent Number: 4,982,259
[45] Date of Patent: Jan. 1, 1991

[54] SENSITIVE THYRISTOR HAVING IMPROVED NOISE-CAPABILITY

[75] Inventors: Shigenori Yakushiji, Yokohama; Kouji Jitsukata, Chiba, both of Japan

[73] Assignee: Kabushiki Kaisha Toshiba, Kawasaki, Japan

[21] Appl. No.: 257,673

[22] Filed: Oct. 14, 1988

[30] Foreign Application Priority Data

Oct. 16, 1987 [JP] Japan ................ 62-260869

[51] Int. Cl.$^5$ .................. H01L 29/747; H01L 27/02; H01L 29/10
[52] U.S. Cl. ....................... 357/38; 357/39; 357/43; 357/23.4
[58] Field of Search ............ 357/38, 38 A, 38 C, 357/38 E, 38 G, 38 L, 38 LA, 38 P, 38 T, 39, 43, 23.4

[56] References Cited

U.S. PATENT DOCUMENTS

| 4,500,902 | 2/1985 | Herberg | 357/38 |
| 4,502,072 | 2/1985 | Herberg | 357/38 |
| 4,717,947 | 1/1988 | Matsuda et al. | 357/38 |

FOREIGN PATENT DOCUMENTS 55-52458 11/1981 Japan ..................... 357/38 P

Primary Examiner—Rolf Hille
Assistant Examiner—Wael Fahmy
Attorney, Agent, or Firm—Finnegan, Henderson, Farabow, Garrett, and Dunner

[57] ABSTRACT

A MOSFET is provided between a main thyristor and an auxiliary thyristor for controlling the main thyristor. The source and drain regions of the MOSFET are also used as a first N-type emitter region of the main thyristor and a second N-type emitter region of the auxiliary thyristor. The MOSFET and the auxiliary thyristor are controlled by an output of a gate energization circuit. When the MOSFET is turned on by an output of the gate energization circuit, the main thyristor is connected to the auxiliary thyristor. At this time, the auxiliary thyristor is turned on by the output of the gate energization circuit, and the main thyristor is also turned on due to the turn-on operation of the auxiliary thyristor. When the MOSFET is in the OFF state, the main thyristor is electrically isolated from the auxiliary thyristor.

22 Claims, 4 Drawing Sheets

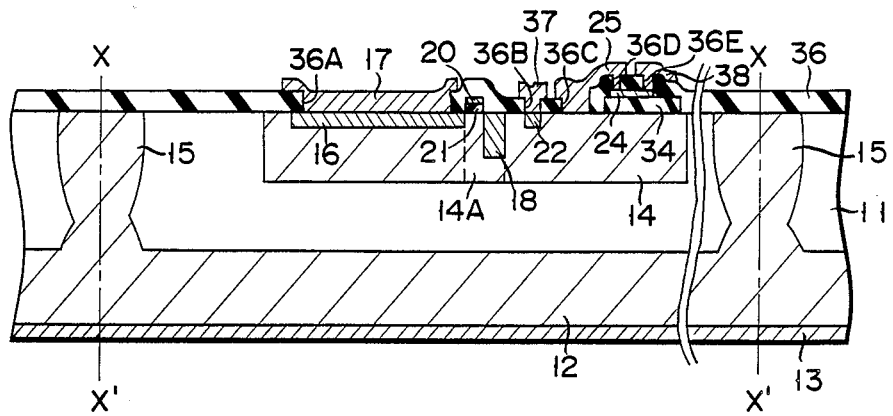
F I G. 2E
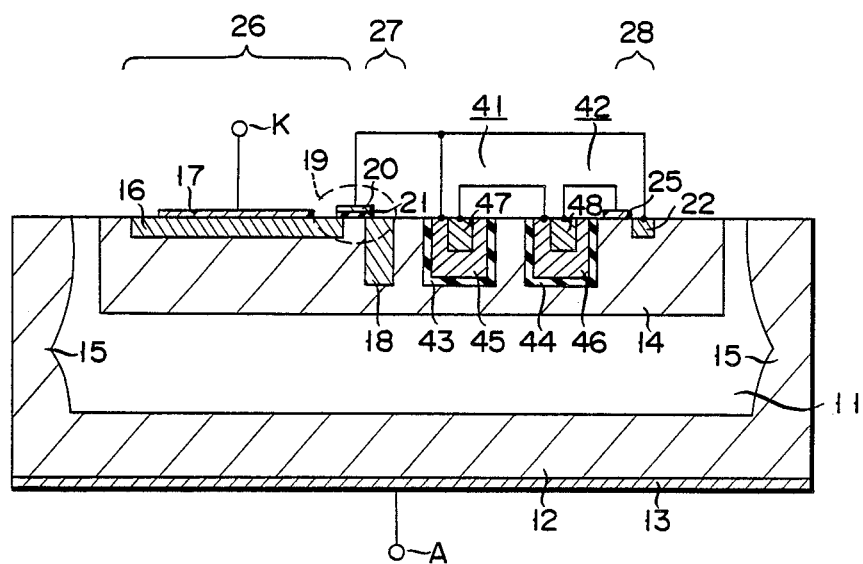
F I G. 3

SENSITIVE THYRISTOR HAVING IMPROVED NOISE-CAPABILITY

BACKGROUND OF THE INVENTION

1. Field of the Invention

This invention relates to a semiconductor device having a main thyristor and an auxiliary thyristor (which is also called a pilot thyristor) formed in a single semiconductor substrate, and more particularly to a sensitive thyristor having an improved noise-capability.

2. Description of the Related Art

In general, a thyristor is widely used to effect various control operations such as ON/OFF control of electric power. The basic structure of the thyristor is explained in the article by ADOLPH BLICHER in "Thyristor Physics" pp. 1 to 13. The thyristor in the OFF state is made conductive when a gate current is increased to a certain value with a preset voltage kept applied between the anode and cathode. The minimum gate current required for turning on the thyristor is called gate turn-on current $I_{GT}$, and the sensitivity of the thyristor becomes higher when current $I_{GT}$ is set to be smaller. Gate turn-on current $I_{GT}$ is controlled by various methods so as to attain a desired ON characteristic.

When an abruptly rising noise voltage is applied between the anode and cathode of the thyristor in the OFF state, the thyristor may be turned on (erroneously triggered) even if no gate current is supplied. The turn-on operation is considered to occur as explained below. First, a junction capacitor between the P-type base region and N-type base region of the thyristor is charged by application of the noise voltage. As a result, a displacement current "Cdv/dt" (C is a capacitance of the junction capacitor) will flow over the entire surface of the junction area. The displacement current has substantially the same effect as the gate current, and at this time, the thyristor is turned on. In this case, voltage variation rate dv/dt immediately before the thyristor is turned on is called the critical off voltage rising rate. When the critical off voltage rising rate is larger, the possibility of the thyristor to be turned on by the noise voltage becomes smaller, and therefore it is preferable to set the critical off voltage rising rate to be larger. The above phenomena are generally called dv/dt characteristics.

The dv/dt characteristics and sensitivity of the thyristor are incompatible with each other. That is, when the sensitivity is set to be high, the dv/dt characteristic will be deteriorated, and when the dv/dt characteristic is enhanced, the sensitivity is lowered.

It is well known in the art that an amplifying gate type thyristor can be used to effect a method for controlling the ON and OFF conditions of a thyristor which is operated with a large driving ability (current capacity) by a small gate current. Such a thyristor is disclosed in "Thyristor Physics" pp. 120–121. The amplifying gate type thyristor includes a main thyristor having a large driving ability (requiring large gate turn-on current $I_{GT}$) and an auxiliary thyristor having a small driving ability (which can be turned on by small gate turn-on current $I_{GT}$). The main thyristor is constituted to have a cathode formed in the form of shorted emitter structure in order to enhance the dv/dt characteristic. In an equivalent circuit of the thyristor, the cathode of the auxiliary thyristor is connected to the gate of the main thyristor, and the anode thereof is connected to the anode of the main thyristor. When a gate current is supplied to the gate of the auxiliary thyristor and exceeds gate turn-on current $I_{GT}$, the thyristor is turned on. As a result, current flowing from the anode to cathode of the auxiliary thyristor is supplied as a gate current to the gate of the main thyristor, thereby turning on the main thyristor. In this way, it is possible to turn on the main thyristor having the large driving ability (current capacity) with a gate current which is relatively small but is large enough to turn on the auxiliary thyristor.

As described above, in the amplifying gate type thyristor, the main thyristor having the large driving ability (current capacity) can be turned on by a relatively small gate current. However, the dv/dt characteristic is not sufficiently improved. This is because the main thyristor will be turned on when the highly sensitive auxiliary thyristor is turned on by a noise voltage even if the dv/dt characteristic of the main thyristor is sufficiently improved. In the amplifying gate type thyristor, the P-type base region of the main thyristor is electrically connected to the P-type base region of the auxiliary thyristor. Therefore, when a noise voltage is applied between the anode and cathode of the main thyristor, the highly sensitive auxiliary thyristor may be turned on even if the main thyristor having the sufficiently improved dv/dt characteristic is not turned on at this time. Thus, the dv/dt characteristic of the amplifying gate type thyristor largely depends on the dv/dt characteristic of the auxiliary thyristor.

In recent years, microcomputers were widely used in the household electric appliances, and it has been required to directly drive the thyristor by an output (small gate current) of an IC. Therefore, it is strongly demanded to develop sensitive thyristors. As described above, however, when the gate sensitivity of the thyristor is enhanced, the dv/dt characteristic thereof is deteriorated, that is, the noise-capability thereof becomes low, causing an erroneous operation due to the noise voltage.

SUMMARY OF THE INVENTION

An object of this invention is to provide a thyristor having a high gate sensitivity and improved noise-capability.

According to one embodiment of this invention, there is provided a thyristor comprising a main thyristor formed in a semiconductor substrate; an auxiliary thyristor formed in the same semiconductor substrate in which the main thyristor is formed and functioning to control the operation of the main thyristor; a MOSFET formed between the main thyristor and the auxiliary thyristor; and an energization circuit for energizing the gates of the MOSFET and the auxiliary thyristor.

With this construction, the main and auxiliary thyristors are separated from each other when the MOSFET is in the OFF state. Therefore, even if a noise voltage is applied to thyristors, the main thyristor will not be turned on. Further, when the MOSFET is in the ON state, the main and auxiliary thyristors are connected to each other. Therefore, if the auxiliary thyristor is turned on, the main thyristor is also turned on.

Thus, a thyristor which has high gate sensitivity and high noise-capability can be provided.

BRIEF DESCRIPTION OF THE DRAWINGS

FIGS. 2A to 2E are cross sectional views sequentially showing the manufacturing steps of manufacturing the thyristor shown in FIG. 1;

FIG. 3 is cross sectional view of a modification of the thyristor shown in FIG. 1;

DETAILED DESCRIPTION OF THE PREFERRED EMBODIMENTS

Figure 1:
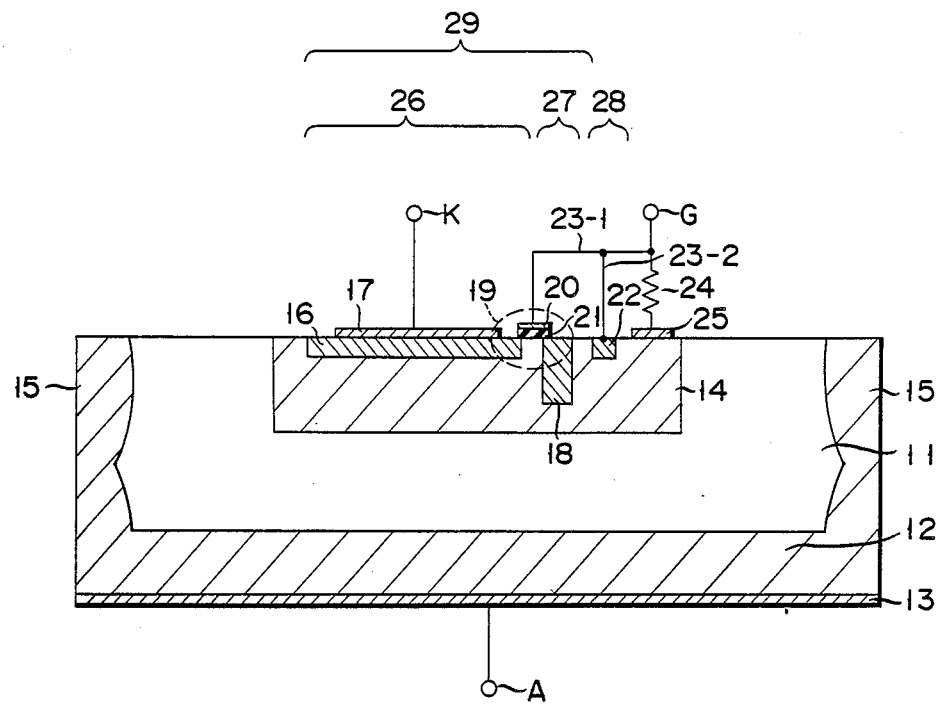
FIG. 1 is a cross sectional view of a thyristor according to a first embodiment of this invention.

FIG. 1 is a cross sectional view of a thyristor according to a first embodiment of this invention. P-type emitter region 12 acting as an anode is formed in the rear surface area of N-type semiconductor substrate (N-type base region) 11. Anode electrode 13 is formed in ohmic contact with P-type emitter region 12. Anode terminal A is connected to anode electrode 13. P-type base region 14 acting as a gate is formed in the front surface area of semiconductor substrate 11. Isolation regions 15 are formed from the front surface to the rear surface of semiconductor substrate 11 to surround P-type base region 14. First N-type emitter region 16 acting as a cathode is formed in the surface area of P-type base region 14 Cathode electrode 17 is formed in ohmic contact with first N-type emitter region 16. Cathode terminal K is connected to cathode electrode 17. Second N-type emitter region 18 is formed separately from and deeper than first N-type emitter region 16 in the surface area of P-type base region 14. Gate electrode 20 of MOSFET 19 is formed on gate insulation film 21 which is formed on that portion of P-type base region 14 which lies between first and second N-type emitter regions 16 and 18. N-type impurity region 22 is formed separately from first and second N-type emitter regions 16 and 18 in the surface area of P-type base region 14. Gate terminal G is connected to gate electrode 20 by use of wiring layer 23-1 and to N-type impurity region 22 by use of wiring layer 23-2. Further, gate terminal G is connected to one end of resistor 24 which is connected at the other end to gate electrode 25 of a thyristor formed in ohmic contact with P-type base region 14.

Main thyristor 26 with PNPN structure is constituted by P-type emitter region 12, N-type semiconductor substrate (N-type base region) 11, P-type base region 14 and first N-type emitter region 16. Further, auxiliary thyristor 27 with PNPN structure is constituted by P-type emitter region 12, N-type semiconductor substrate (N-type base region) 11, P-type base region 14 and second N-type emitter region 18. Since second N-type emitter region 18 of auxiliary thyristor 27 is formed deeper than first N-type emitter region 16, the sensitivity of auxiliary thyristor 27 is set to be higher than that of main thyristor 26. MOSFET 19 includes first and second N-type emitter regions 16 and 18, P-type base region 14, gate insulation film 21 and gate electrode 20. First and second N-type emitter regions 16 and 18 act as source and drain regions, and that portion of P-type base region 14 which lies between first and second N-type emitter regions 16 and 18 acts as a channel region. Zener diode 28 is formed of P-type base region 14 and N-type impurity region 22, and is used to protect the gate insulation film of MOSFET 19.

Figure 2A:
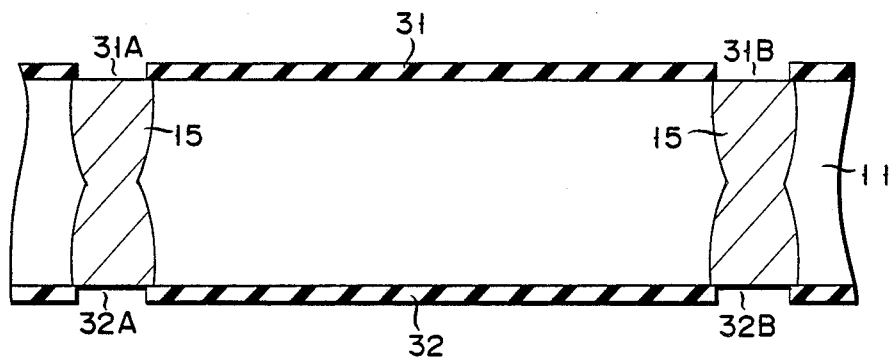

FIGS. 2A to 2E are cross sectional views sequentially showing the manufacturing steps of manufacturing the thyristor shown in FIG. 1. First, as shown in FIG. 2A, oxide films 31 and 32 are respectively formed on the front and rear surfaces of N-type semiconductor substrate (silicon substrate) 11 with the resistivity of 40 Ω.cm. Semiconductor substrate 11 is used as an N-type base region. Openings 31A and 31B are formed by a PEP method in portions of oxide film 31 corresponding in position to the area in which isolation regions 15 are formed. Likewise, openings 32A and 32B are formed by a PEP method in portions of oxide film 32 corresponding in position to the area in which isolation regions 15 are formed. Then, P-type impurity is doped into semiconductor substrate 11 via openings 31A, 31B, 32A and 32B from both sides of semiconductor substrate 11 so as to form isolation regions 15.

Figure 2B:
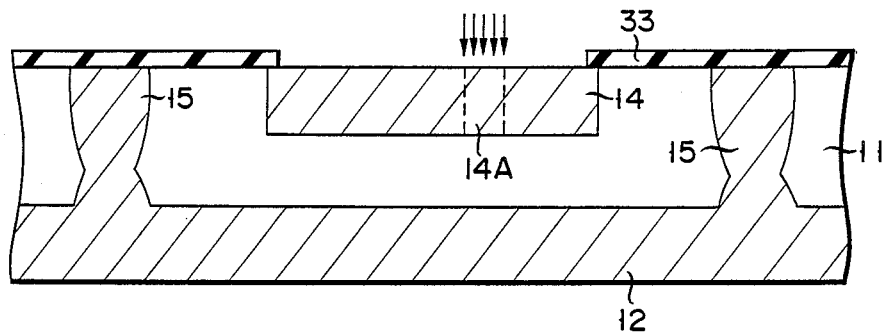
Figure 2C:
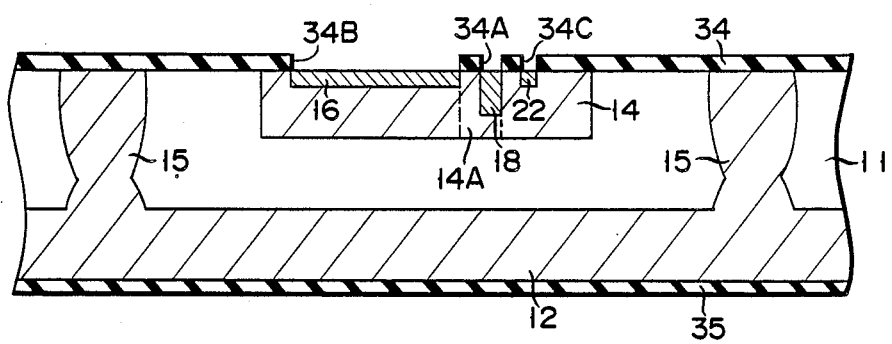

Next, as shown in FIG. 2B, oxide films 31 and 32 are removed and then oxide film 33 is formed on the upper surface of the resultant semiconductor structure. Part of oxide film 33 which lies on the formation area for formation of P-type base region 14 is selectively removed by a PEP method. Then, a P-type impurity is doped into semiconductor substrate 11 from the both sides thereof with oxide film 33 used as a mask. At this time, for example, boron is deposited to the exposed surface of semiconductor substrate 11 in a heat treatment process at a temperature of 1000° C. for approx. one hour and is diffused to a depth of 40 μm. In this way, P-type emitter region 12 and P-type base region 14 with a surface impurity concentration of $1 \times 10^{18}$ to $5 \times 10^{18}$ atoms/cm$^3$ can be formed at the same time. Then, an N-type impurity is selectively ion-implanted into a portion of P-type base region 14 which lies in position corresponding to an area for formation of the channel region of MOSFET 19 so as to form impurity region 14A whose P-type impurity concentration is reduced to approx. $1 \times 10^{17}$ atoms/cm$^3$.

After this, remaining oxide film 33 is removed, and oxide films 34 and 35 are formed on both surfaces of the resultant semiconductor structure. Openings 34A is formed by a PEP method in a portion of oxide film 34 corresponding in position to the area for formation of second N-type emitter region 18. Then, an N-type impurity is doped into the surface area of semiconductor substrate 11 with oxide films 34 and 35 used as a mask. Subsequently, openings 34B and 34C are formed by a PEP method in those portions of oxide film 34 which lie on the areas for formation of first N-type emitter region 16 and N-type impurity region 22. Then, an N-type impurity is doped into the surface area of semiconductor substrate 11 with oxide films 34 and 35 used as a mask. In this case, phosphor is adhered to the exposed surface of semiconductor substrate 11 in a heat treatment process at a temperature of 1100° C. for approx. 30 minutes and is diffused to a depth of 12 μm. In this way, first N-type emitter region 16, second N-type emitter region 18 and N-type impurity region 22 with a surface impurity concentration of $1 \times 10^{21}$ atoms/cm$^3$ or more can be formed. Since impurity doping steps are effected twice to form second N-type emitter region 18, the diffusion depth thereof becomes deep and as a result the construction shown in FIG. 2C can be obtained.

Figure 2D:
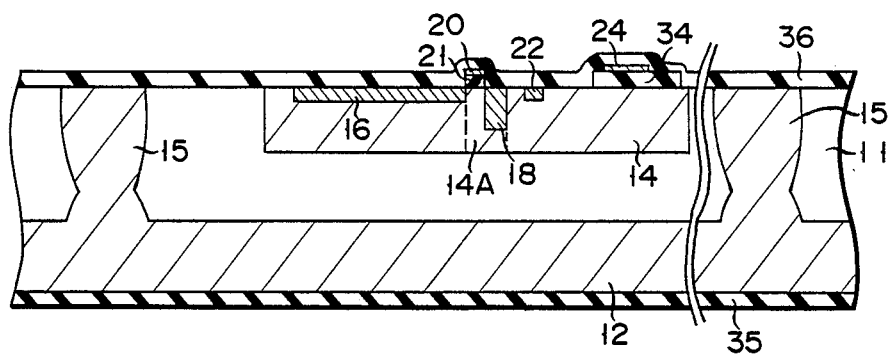

Next, remaining oxide film 34 is selectively removed, and a thin oxide film used as gate insulation film 21 is formed on that portion of P-type base region 14 which lies between first and second N-type emitter regions 16 and 18. After a polysilicon layer is formed on gate insulation film 21 and oxide film 34, the polysilicon layer is patterned to form gate electrode 20 and resistor 24. The resistance value of the resistor 24 is controlled by ionimplantation technique. Then, oxide film 36 is formed on the surface of the resultant semiconductor structure as shown in FIG. 2D.

After this, openings 36A, 36B, 36C, 36D and 36E are formed by a PEP method in oxide film 36 in positions corresponding to first N-type emitter region 16, N-type impurity region 22, P-type base region 14 and ends of resistor 24, and oxide film 35 is removed. Then, metal such as aluminum is vapor deposited on both surfaces of the resultant semiconductor structure and is patterned. As a result, anode electrode 13, cathode electrode 17, cathode extraction electrode 37 of a Zener diode, gate electrode 25 and gate extraction electrode 38 of a thyristor are formed as shown in FIG. 2E.

Next, semiconductor substrate 11 is cut along X—X' lines in FIG. 2E, and then anode electrode 13 and cathode electrode 17 are connected to anode terminal A and cathode terminal K, respectively. Gate electrode 20 of MOSFET 19 and electrode 37 are connected to gate terminal G via wiring layers 23-1 and 23-2, respectively. Further, gate extraction electrode 38 is connected to gate terminal G to form a thyristor shown in FIG. 1.

Now, the operation of the thyristor shown in FIG. 1 is explained. In a case where no voltage is applied to gate terminal G, main thyristor 26, auxiliary thyristor 27 and MOSFET 19 are all turned off. In this case, since main thyristor is constituted to have an improved dv/dt characteristic, main thyristor 26 is not easily turned on even if a noise voltage is applied between anode terminal A and cathode terminal K. Further, since auxiliary thyristor 27 is separated from main thyristor 26 by means of MOSFET 19 which is now in the OFF state, main thyristor 26 will not be turned on.

In a case where a voltage is applied to gate terminal G, MOSFET 19 is turned on and the conductivity type of the channel region is inverted into N-type, thereby connecting first N-type emitter region 16 to second N-type emitter region 18. Therefore, main thyristor 26 and auxiliary thyristor 27 are connected to each other. In other words, main thyristor 26 and auxiliary thyristor 27 are combined to function as one thyristor 29 having a high gate sensitivity area (auxiliary thyristor section 27). In this case, a gate current flows from gate terminal G to P-type base region 14 or the gate of auxiliary thyristor 27 via resistor 24. As a result, auxiliary thyristor 27 is turned on. The effect due to the turn-on of auxiliary thyristor 27 is transferred to main thyristor 26 via MOSFET 19, and main thyristor 26 is also turned on. Since the threshold voltage of MOSFET 19 is approx. 1.5 V and voltage $V_{GT}$ for turning on auxiliary thyristor 27 is 0.5 V, it is sufficient to set a voltage applied to gate terminal G when auxiliary thyristor 27 is turned on to approx. 2 V. At this time, gate turn-on current $I_{GT}$ of auxiliary thyristor 27 is approx. 10 μA and auxiliary thyristor 27 is sufficiently sensitive. Resistor 24 is used to adjust threshold voltage $V_{TH}$ of auxiliary thyristor 28 and gate turn-on voltage $V_{GT}$ so as to attain an adequate gate current. Further, breakdown occurs in Zener diode 28 when a high voltage is applied to gate terminal G so that gate insulation film 21 of MOSFET 19 can be effectively prevented from being damaged.

FIG. 3 shows a modification of the thyristor shown in FIG. 1. The thyristor is triggered by irradiation of light. That is, in the thyristor of FIG. 1, auxiliary thyristor 27 is triggered by applying voltage to gate terminal G and supplying a gate current to auxiliary thyristor 27 via resistor 24. In contrast, the thyristor shown in FIG. 3 is triggered by irradiation of light. In FIG. 3, portions which are similar to those of the thyristor shown in FIG. 1 are denoted by the same reference numerals and the explanation therefor is omitted. In the thyristor of FIG. 3, photodiodes 41 and 42 are embedded in that portion of P-type base region 14 which lies between second N-type emitter region 18 and N-type impurity region 22. Photodiodes 41 and 42 are isolated from P-type base region 14 by means of insulation films 43 and 44, respectively. Photodiodes 41 and 42 are respectively formed of P-type impurity regions 45 and 46 acting as an anode region and N-type impurity regions 47 and 48 formed in the surface area of respective impurity regions 45 and 46. P-type impurity region 45 of photodiode 41 is connected to gate electrode 20 of MOSFET 19, and N-type impurity region 47 of photodiode 41 is connected to P-type impurity region 46 of photodiode 42. Further, N-type impurity region 48 of photodiode 42 is connected to P-type base region 14.

With the construction described above, when light is applied to photodiodes 41 and 42, an electromotive force is generated and is applied to the gate of MOSFET 19 to turn on the same. At the same time, current caused by the electromotive force is supplied to P-type base region 14 or the gate of auxiliary thyristor 28 to turn on auxiliary thyristor 28. As a result, main thyristor 27 is also turned on. When no light is irradiate, the thyristor is set under the same condition as that in which the thyristor of FIG. 1 is set when no voltage is applied to gate terminal G. Therefore, even if a noise voltage is applied between anode terminal A and cathode terminal K, main thyristor 26 will not be turned on.

Figure 4:
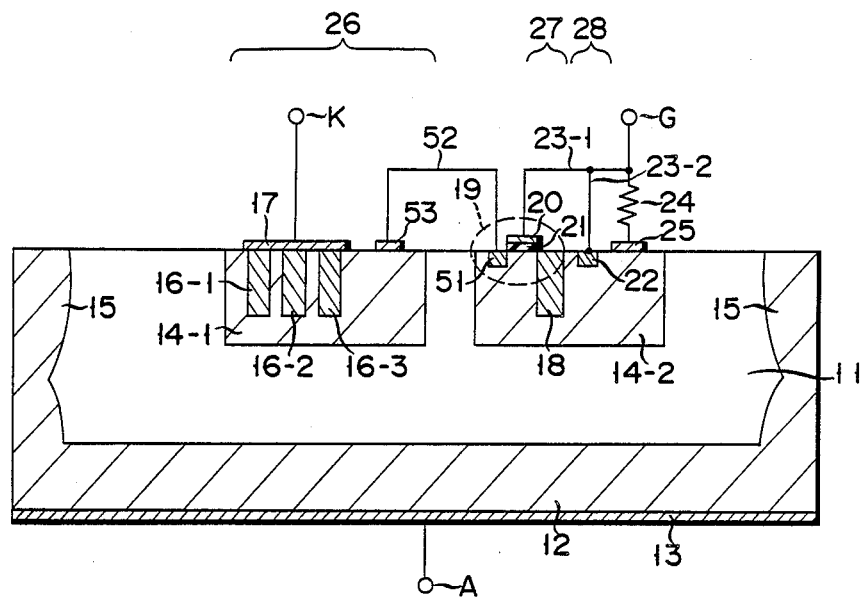
FIG. 4 is a cross sectional view of a thyristor according to a second embodiment of this invention.

FIG. 4 shows a thyristor according to a second embodiment of this invention. The thyristor is constructed by applying this invention to the amplifying gate type thyristor.

P-type emitter region 12 acting as an anode is formed in the rear surface area of N-type semiconductor substrate (N-type base region) 11. Anode electrode 13 is formed in ohmic contact with P-type emitter region 12. Anode terminal A is connected to anode electrode 13. First P-type base region 14-1 acting as a gate of the main thyristor is formed in the front surface area of semiconductor substrate 11. Second P-type base region 14-2 acting as a gate of the auxiliary thyristor is formed separately from P-type base region 14-1 in the front surface area of semiconductor substrate 11. Isolation regions 15 are formed from the front surface to the rear surface of semiconductor substrate 11 to surround first and second P-type base regions 14-1 and 14-2. First to third N-type emitter regions 16-1 to 16-3 acting as a cathode of the main thyristor is formed in the surface area of P-type base region 14-1. Cathode electrode 17 is formed in ohmic contact with first to third N-type emitter regions 16-1 to 16-3. Cathode terminal K is connected to cathode electrode 17. Fourth N-type emitter region 18 is formed in the surface area of second P-type base region 14-2. N-type impurity region 51 is formed separately from fourth N-type emitter region 18 in the surface area of second P-type base region 14-2. Further, N-type impurity region 51 is connected to gate electrode 53 of the main thyristor which is ohmic contact with first P-type base region 14-1 via wiring layer 52. Gate electrode 20 of MOSFET 19 is formed on gate insulation film 21 which is formed on that portion of second P-type base region 14-2 which lies between fourth N-type emitter region 18 and N-type impurity region 51. N-type impurity region 22 is formed separately from fourth N-type emitter region 18 and N-type impurity region 51 in the surface area of second P-type base region 14-2. Gate terminal G is connected to gate electrode 20 by use of wiring layer 23-1 and to N-type impurity region 22 by use of wiring layer 23-2. Further, gate terminal G is connected to one end of resistor 24 which is connected at the other end to gate electrode 25 of an auxiliary thyristor formed in ohmic contact with second P-type base region 14-2.

Main thyristor 26 with PNPN structure is constituted by P-type emitter region 12, N-type semiconductor substrate (N-type base region) 11, first P-type base region 14-1 and first to third N-type emitter regions 16-1 to 16-3. Thus, main thyristor 26 has a shorted emitter structure. Further, auxiliary thyristor 27 with PNPN structure is constituted by P-type emitter region 12, N-type semiconductor substrate (N-type base region) 11, second P-type base region 14-2 and fourth N-type emitter region 18. Main thyristor 26 is formed to have a shorted emitter structure and has an enhanced dv/dt characteristic. In contrast, auxiliary thyristor 27 is formed to have a high sensitivity. MOSFET 19 includes fourth N-type emitter region 18, N-type impurity region 51, second P-type base region 14-2, gate insulation film 21 and gate electrode 20. Fourth N-type emitter region 18 and N-type impurity region 51 act as source and drain regions, and that portion of second P-type base region 14-2 which lies between fourth N-type emitter region 18 and N-type impurity regions 51 acts as a channel region. Zener diode 28 is formed of second P-type base region 14-2 and N-type impurity region 22, and is used to protect gate insulation film 21 of MOSFET 19.

Now, the operation of the thyristor shown in FIG. 4 is explained. The operation is similar to that of the thyristor shown in FIG. 1 except the turn-on process of main thyristor 26. In a state wherein no voltage is applied to gate terminal G, main thyristor 26, auxiliary thyristor 27 and MOSFET 19 are all set in the OFF condition. That is, at this time, main thyristor 26 and auxiliary thyristor 27 are electrically separated from each other by MOSFET 19 which is in the OFF condition. Under this condition, even if a noise voltage is applied between anode terminal A and cathode terminal K, main thyristor 26 which has an enhanced dv/dt characteristic is not easily turned on. In this case, auxiliary thyristor 27 which is sensitive may be turned on and is thus erroneously triggered. However, since MOSFET 19 is turned off, no gate current is supplied to gate electrode 53 (first P-type base region 14-1) of main thyristor 26. As a result, main thyristor 26 will not be erroneously triggered even when auxiliary thyristor 27 is erroneously triggered.

In a case where a voltage is applied to gate terminal G MOSFET 19 is turned on so that gate electrode 53 of main thyristor 26 and the cathode (N-type emitter region 18) of auxiliary thyristor 27 can be electrically connected via the current path of MOSFET 19 and wiring layer 52. At this time, a gate current is supplied to gate electrode 25 of auxiliary thyristor 27 via resistor 24 by application of voltage to gate terminal G. As a result, auxiliary thyristor 27 is turned on. The turnon operation of auxiliary thyristor 27 causes a current flowing between the anode and cathode of auxiliary thyristor 27 to be supplied as a gate current of main thyristor 26, thereby turning on main thyristor 26.

The inventors of this invention made for experiment the conventional amplifying gate type thyristor and a thyristor with the construction shown in FIG. 4, both thyristors being formed to have rated current and voltage of 10 A and 600 V. In the thyristor with the construction shown in FIG. 4, gate turn-on current $I_{GT}$ of 10 $\mu$A and dv/dt of 400 V/$\mu$s were obtained when the resistance of resistor 24 was set to 200 K$\Omega$. In contrast, in the conventional amplifying gate type thyristor, gate turn-on current $I_{GT}$ of 100 $\mu$A and dv/dt of 200 V/$\mu$s were obtained when the resistance of an input resistor (corresponding to resistor 24 used in this invention) was set to 200 K$\Omega$. Thus, it was determined that the sensitivity of the thyristor of this invention is sufficiently high and the dv/dt characteristic is significantly improved in comparison with that of the conventional thyristor.

Figure 5:
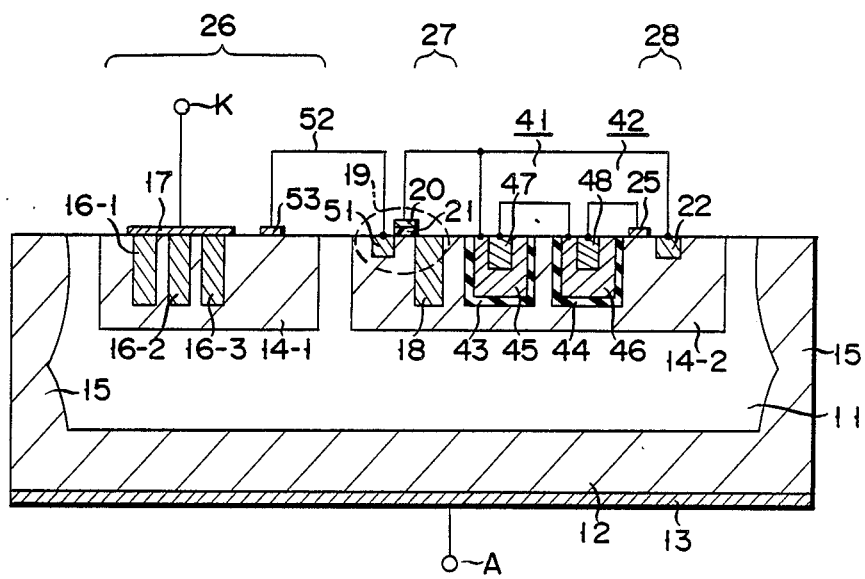
FIG. 5 is a cross sectional view of a modification of the thyristor shown in FIG. 4.

FIG. 5 shows a modification of the thyristor shown in FIG. 4. The thyristor is triggered by irradiate of light, and is formed by combining the structures of FIGS. 3 and 4. In FIG. 5, the turn-on mechanism of auxiliary thyristor 27 by application of light is the same as that of FIG. 3, and the basic operation of the thyristor is the same as that of the thyristor shown in FIG. 4. Therefore, portions which are the same as those in FIGS. 3 and 4 are denoted by the same reference numerals and the explanation thereof is omitted.

With this construction, the operation which is substantially the same as those in the foregoing embodiments is effected and the same effect can be obtained.

As described above, according to this invention, a thyristor having a high gate sensitivity and improved noise-capability can be provided.

What is claimed is:

1. A thyristor comprising:
   a second conductive type semiconductor substrate acting as a second conductive type base region;
   a first conductive type emitter region formed in one of two surface areas of said semiconductor substrate;
   an anode electrode formed in ohmic contact with said first conductive type emitter region;
   a first conductive type base region formed in the other surface area of said semiconductor substrate;
   a main second conductive type emitter region formed in the surface area of said first conductive type base region;
   a cathode electrode formed in ohmic contact with said main second conductive type emitter region;
   an auxiliary second conductive type emitter region formed separately from and deeper than said main second conductive type emitter region in the surface area of said first conductive type base region;
   a gate insulation film formed on a portion of said first conductive type base region lying between said main and auxiliary second conductive type emitter regions;
   a first gate electrode formed on said gate insulation film;
   a second gate electrode formed in ohmic contact with said first conductive type base region;
   gate energization means, coupled to said first and second gate electrodes, for energizing said first and second gate electrodes; and
   a second conductive type diode region formed separately from said main and auxiliary second conductive type emitter regions in the surface area of said first conductive type base region, and coupled to said gate energization means, wherein said second conductive type diode region and said first conductive type base region provide a Zener diode for protecting the gate insulation film.

2. A thyristor according to claim 1, wherein said gate energization means includes a gate terminal connected to said first gate electrode and a resistor connected between said gate terminal and said second gate electrode.

3. A thyristor according to claim 1, wherein said gate energization means includes a photodiode connected between said first and second electrodes.

4. A thyristor comprising:
- a second conductive type semiconductor substrate acting as a second conductive type base region;
- a first conductive type emitter region formed in one of two surface areas of said semiconductor substrate;
- an anode electrode formed in ohmic contact with said first conductive type emitter region;
- a main first conductive type base region formed in the other surface area of said semiconductor substrate;
- a plurality of main second conductive type emitter regions formed in the surface area of said main first conductive type base region;
- a cathode electrode formed in ohmic contact with said main first conductive type base region and said main second conductive type emitter regions;
- an auxiliary first conductive type base region which is formed separately from said main first conductive type base region in the other surface area of said semiconductor substrate;
- an auxiliary second conductive type emitter region formed in the surface area of said auxiliary first conductive type base region;
- a second conductive type drain region formed separately from said auxiliary second conductive type emitter region in the surface area of said auxiliary first conductive type base region;
- means for coupling said second conductive type drain region to said main first conductive type base region;
- a gate insulation film formed on a portion of said auxiliary first conductive type base region which lies between said auxiliary second conductive type emitter region and said second conductive type drain region;
- a first gate electrode formed on said gate insulation film;
- a second gate electrode formed in ohmic contact with said auxiliary first conductive type base region;
- gate energization means, coupled to said first and second gate electrodes, for energizing said first and second gate electrodes; and
- a second conductive type diode region formed separately from said auxiliary second conductive type emitter region in the surface area of said auxiliary first conductive type base region, and coupled to said gate energization means, wherein said second conductive type diode region and said auxiliary first conductive type base region form a Zener diode for protecting the gate insulation film.

5. A thyristor according to claim 4, wherein said gate energization means includes a gate terminal connected to said first gate electrode and a resistor connected between said gate terminal and said second gate electrode.

6. A thyristor according to claim 4, wherein said gate energization means includes a photodiode connected between said first and second gate electrodes.

7. A thyristor according to claim 6, in which the first conductive type regions are P-type and the second conductive type regions are N-type.

8. A thyristor according to claim 5, in which the first conductive type regions are P-type and the second conductive type regions are N-type.

9. A thyristor according to claim 4, in which the first conductive type regions are P-type and the second conductive type regions are N-type.

10. A thyristor according to claim 3, in which the first conductive type regions are P-type and the second conductive type regions are N-type.

11. A thyristor according to claim 2, in which the first conductive type regions are P-type and the second conductive type regions are N-type.

12. A thyristor according to claim 1, in which the first conductive type regions are P-type and the second conductive type regions are N-type.

13. A thyristor comprising:
- a second conductive type semiconductor substrate acting as a second conductive type base region;
- a first conductive type emitter region formed in one of two surface areas of said semiconductor substrate;
- an anode electrode formed in ohmic contact with said first conductive type emitter region;
- a first conductive type base region formed in the other surface area of said semiconductor substrate;
- a main second conductive type emitter region formed in the surface area of said first conductive type base region to provide a main thyristor;
- a cathode electrode formed in ohmic contact with said main second conductive type emitter region;
- an auxiliary second conductive type emitter region, formed separately from said main second conductive type emitter region in the surface area of said first conductive type base region; and having a different structure than the structure of said main second conductive type emitter region, to provide an auxiliary thyristor having a higher sensitivity than the sensitivity of the main thyristor;
- a gate insulation film formed on a portion of said first conductive type base region lying between said main and auxiliary second conductive type emitter regions;
- a first gate electrode formed on said gate insulation film to provide a transistor;
- a second gate electrode formed in ohmic contact with said first conductive type base region;
- gate energization means, coupled to said first and second gate electrodes, for energizing said first gate electrode to electrically connect the auxiliary thyristor to the main thyristor via the transistor at times when the first gate electrode is energized, and for energizing said second gate electrode to turn on the auxiliary thyristor at times when the second gate electrode is energized; and
- a second conductive type diode region formed separately from said main and auxiliary second conductive type emitter regions in the surface area of said first conductive type base region, and coupled to said gate energization means, wherein said second conductive type diode region and said first conductive type base region provide a Zener diode for protecting the gate insulation film.

14. A thyristor according to claim 13, in which said auxiliary second conductive type emitter region is formed deeper than said main second conductive type emitter region to increase the sensitivity of the auxiliary thyristor.

15. A thyristor according to claim 14, wherein said gate energization means includes a gate terminal connected to said first gate electrode and a resistor connected between said gate terminal and said second gate electrode.

16. A thyristor according to claim 13, wherein said gate energization means includes a gate terminal connected to said first gate electrode and a resistor connected between said gate terminal and said second gate electrode.

17. A thyristor according to claim 14, wherein said gate energization means includes a photodiode connected between said first and second gate electrodes.

18. A thyristor according to claim 13, wherein said gate energization means includes a photodiode connected between said first and second gate electrodes.

19. A thyristor according to claim 13, in which the first conductive type regions are P-type and the second conductive type regions are N-type.

20. A thyristor according to claim 15, in which the first conductive type regions are P-type and the second conductive type regions are N-type.

21. A thyristor according to claim 14, in which the first conductive type regions are P-type and the second conductive type regions are N-type.

22. A thyristor according to claim 13, in which the first conductive type regions are P-type and the second conductive type regions are N-type.

* * * * *

UNITED STATES PATENT AND TRADEMARK OFFICE
CERTIFICATE OF CORRECTION

PATENT NO. : 4,982,259
DATED : January 01, 1991
INVENTOR(S) : Shigenori Yakushiji et al.

It is certified that error appears in the above-identified patent and that said Letters Patent is hereby corrected as shown below:

Claim 19, column 12, line 4, change "13" to --16--.

Signed and Sealed this

Twenty-third Day of March, 1993

*Attest:*

STEPHEN G. KUNIN

*Attesting Officer*       *Acting Commissioner of Patents and Trademarks*